United States Patent
Kinbara

(10) Patent No.: US 7,948,731 B2
(45) Date of Patent: May 24, 2011

(54) STATIC ELIMINATOR, AND MICROPHONE ELECTRETIZING METHOD AND APPARATUS USING STATIC ELIMINATOR

(75) Inventor: Taro Kinbara, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/877,555

(22) Filed: Sep. 8, 2010

(65) Prior Publication Data

US 2010/0328836 A1 Dec. 30, 2010

Related U.S. Application Data

(63) Continuation of application No. PCT/JP2009/002493, filed on Jun. 3, 2009.

(30) Foreign Application Priority Data

Jun. 4, 2008 (JP) ................................. P2008-147023

(51) Int. Cl.
*H02H 1/00* (2006.01)
(52) U.S. Cl. ....................................................... 361/212
(58) Field of Classification Search ................... 361/212
See application file for complete search history.

(56) References Cited

U.S. PATENT DOCUMENTS

| 4,271,451 | A | * | 6/1981 | Metz | 361/213 |
| 5,899,708 | A | | 5/1999 | Tanaka et al. | |
| 7,705,611 | B2 | * | 4/2010 | Ogata et al. | 324/661 |
| 2007/0274544 | A1 | | 11/2007 | Takeuchi et al. | |
| 2009/0129612 | A1 | | 5/2009 | Takeuchi et al. | |

FOREIGN PATENT DOCUMENTS

| JP | 3-7189 | 2/1991 |
| JP | 9-331068 | 12/1997 |
| JP | 2001-118749 | 4/2001 |
| JP | 2007-294858 | 11/2007 |
| WO | WO 2006/132193 A1 | 12/2006 |

* cited by examiner

*Primary Examiner* — Stephen W Jackson

(74) *Attorney, Agent, or Firm* — McDermott Will & Emery LLP

(57) ABSTRACT

The static eliminator includes an ionizer including a power source and an electrode which applies ions to an electretized dielectric film to eliminate electric charges formed on the electretized dielectric film. The electrified substance is in an electrically non-grounded state when the electric charges on the electretized dielectric film are eliminated.

14 Claims, 3 Drawing Sheets

STATIC ELIMINATOR, AND MICROPHONE ELECTRETIZING METHOD AND APPARATUS USING STATIC ELIMINATOR

CROSS-REFERENCE TO RELATED APPLICATIONS

This application is a continuation of International Application No. PCT/JP2009/002493 filed on Jun. 3, 2009, which claims priority to Japanese Patent Application No. 2008-147023 filed on Jun. 4, 2008, the entire contents of which are incorporated herein by reference.

TECHNICAL FIELD

The present invention relates to an static eliminator and a microphone electretizing method and apparatus, and more particularly to reductions of a sensitivity change accompanied by a change in an amount of electric charges retained in a dielectric film charged by electretization, the change in the amount being caused by applying ions from an ionizer to the dielectric film.

BACKGROUND ART

An MEMS microphone is an acousto-electric transducer including an electret film having semi-permanent polarization which is manufactured by embedding electric charges through an electretization process, thereby eliminating a need for a direct current bias of a condenser. The electret film is produced by injecting electric charges into a dielectric film and fixing the thus-injected electric charges. An electric field formed by the injected charges causes a potential difference across electrodes of the condenser. As used herein, the term "electretization" means a process for injecting electric charges into a dielectric film so as to fix the electric charges in the dielectric film (i.e., so as to allow the dielectric film to retain the electric charges), and a term "retained charge amount" means an amount of fixed electric charges.

An MEMS (Micro Electromechanical System) microphone manufactured by processing a silicon substrate using a semiconductor processing technique has recently gained attention. The electretization method used for the MEMS microphone is a method for electretizing a dielectric film in an MEMS microphone chip, which is produced by micromachining a silicon substrate, mounted on a mounting board, or in the MEMS microphone chip per se. In the electretization method, one or more MEMS microphone chips are subjected to at least one corona discharge process using one needle electrode or wire electrode, thereby electretizing the dielectric film (Patent Document 1).

As a high-precision electretizing method, there is a method in which corona discharge is performed above a fixed electrode while a dielectric film of a condenser microphone is set to a ground potential and the fixed electrode is set to an electric potential different from the ground potential, thereby electretizing the dielectric film (Patent Document 2).

Patent Document 1: International Publication WO 2006/132193
Patent Document 2: JP-A-2007-294858

SUMMARY OF THE INVENTION

In an electronic device, influence of electrostatic discharge (ESD) (dielectric breakdown of a circuit system, absorption of an extraneous matter, etc.) cannot be ignored. For this reason, elimination of electric charges on an electrified substance by an ionizer is indispensable.

Accordingly, a static elimination process for eliminating unnecessary charges is performed, in which ions are applied from the ionizer to an electretized dielectric film.

However, the applicant has found that the retained charge amount changes by an application of ions from the ionizer to the electretized dielectric film, according to an experiment. A conceivable reason for this phenomenon is that electric charges escape from the electretized dielectric film, in association with the application of ions by the ionizer.

Moreover, the retained charge amount is proportional to sensitivity of a microphone. For this reason, a change in the retained charge amount caused by applying ions from the ionizer results in a variation in sensitivity of the microphone. Therefore, there is a need to reduce the change in the retained charge amount.

The present invention was made in consideration of the above circumstances, and an object thereof is to provide a microphone with reduced sensitivity variations, which can eliminate electric charges on an electrified substance by use of an ionizer while reducing the change in the amount of electric charges retained in an electretized dielectric film.

Another object of the present invention is to eliminate unnecessary electric charges.

In an aspect of the invention, a static eliminator includes an ionizer comprising a power source and an electrode which applies ions to an electretized dielectric film to eliminate electric charges formed on the electretized dielectric film, wherein the electretized dielectric film is in an electrically non-grounded state when electric charges on the electretized dielectric film are eliminated.

According to the aspect of the invention, it is possible to reduce a change in a retained charge amount of the electretized dielectric film while a static elimination effect provided by the ionizer is maintained, so that the charges retained in the electretized dielectric film can be less likely to escape, influence of the change in retained electric charges caused by the ionizer can be reduced, and a variation in microphone sensitivity can also be reduced.

The applicant has found that the change in the retained charge amount occurs only when ions from the ionizer are directly applied to the electretized dielectric film and also when a grounded conductive substance is placed below the dielectric film according to an experiment. Further, it has been also found that the change in the retained charge amount also occurs even when an insulating substance is interposed between the dielectric film and the conductive substance.

Accordingly, the conductive substance located below the electretized dielectric film may be maintained in the non-grounded state such that the conductive substance is not connected to a ground. Consequently, it is possible to prevent pull-in of ions to the dielectric film by an electric field generated when an electric current flows from the conductive substance to the ionizer by the ground connection thereby forming a loop circuit. As a result, the charges retained in the dielectric film are less likely to escape, which can reduce the change in the retained charge amount and a change in microphone sensitivity.

Even when there is provided a structure in which the conductive substance is not placed below the electretized dielectric film, an electric field by formation of the loop circuit is not generated, and an advantage similar to that described above can be provided.

As used herein, the term "non-grounded state" means a non-potentially-connected state, i.e., a floating state, for preventing an electric current flowing in the dielectric film.

As described above, one aspect of the present invention can prevent the loop circuit formed by flow of the electric current from a conductive substance to an ionizer, by not grounding the conductive substance located in the vicinity of an electretized dielectric substance. Therefore, it is possible to inhibit occurrence of pull-in of ions to the dielectric film, which is caused by an electric field generated when the loop circuit is formed by flow of the electric current from the conductive substance to the ionizer. Consequently, the change in the retained charge amount caused by the ionizer is reduced, whereby the variation in the retained charge amount is reduced, which can lead to a reduction of the change in sensitivity of a product, e.g., a microphone.

DETAILED DESCRIPTION OF THE EXEMPLIFIED EMBODIMENTS OF THE INVENTION

Figure 1:
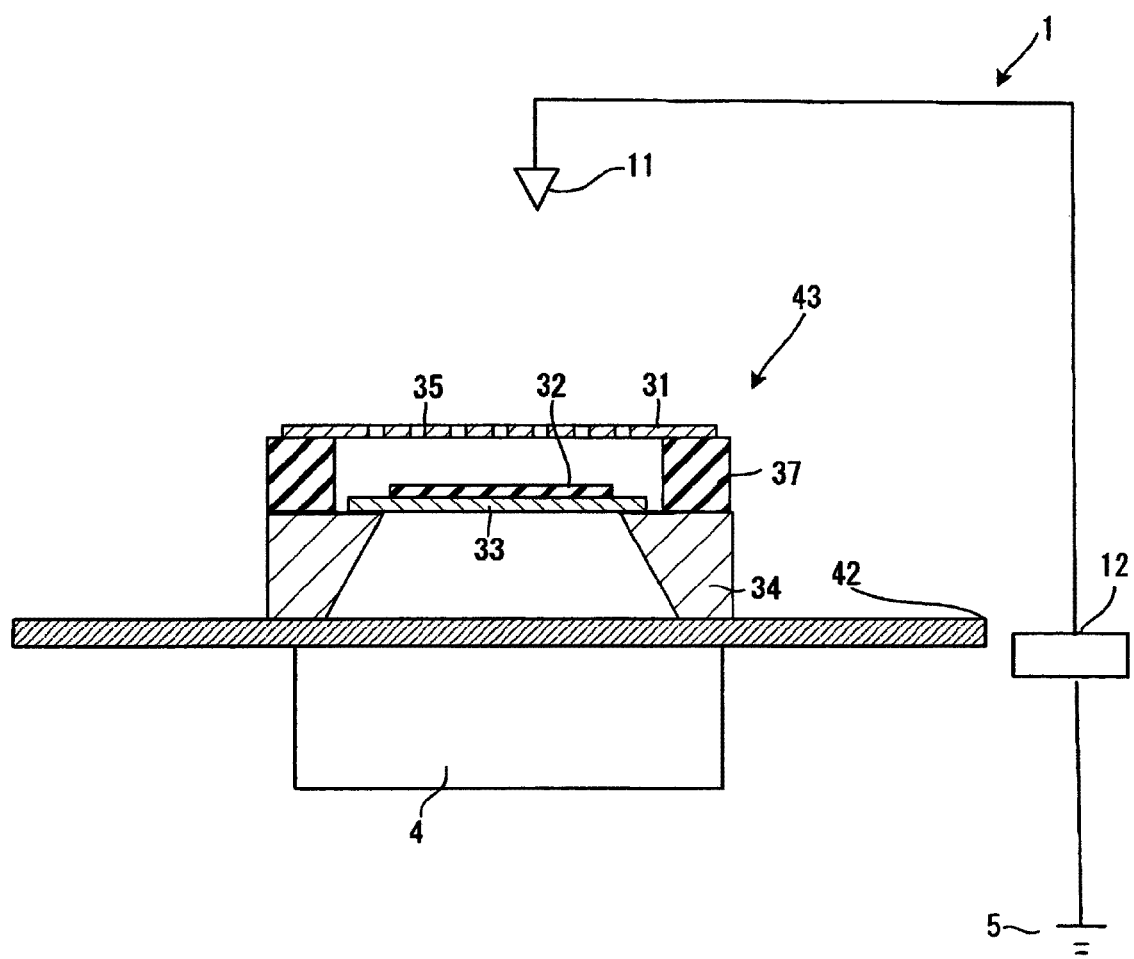
FIG. 1 is a schematic diagram of ionizer-installed facilities of an embodiment of the present invention.
Figure 2:
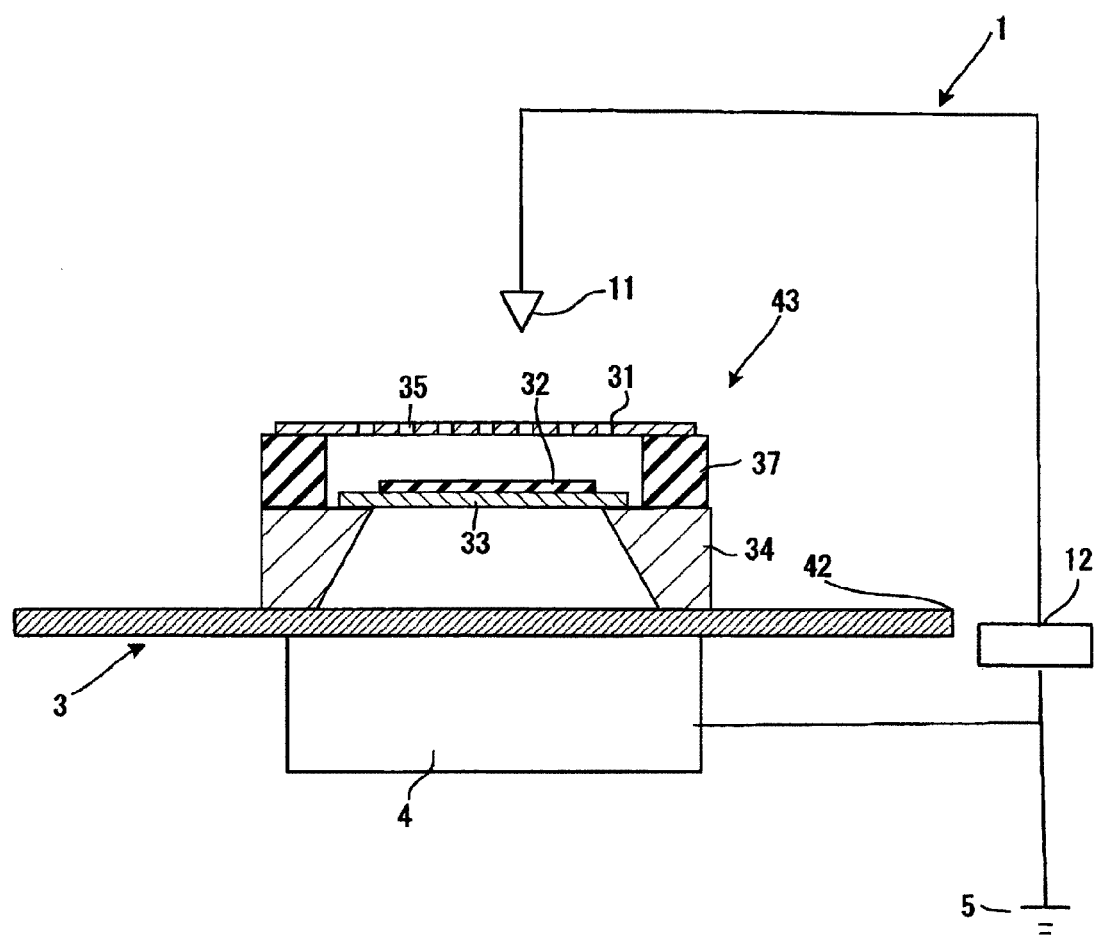
FIG. 2 is a schematic diagram showing that processing pertaining to an electretization process is performed by use of the ionizer-installed facilities.
Figure 3:
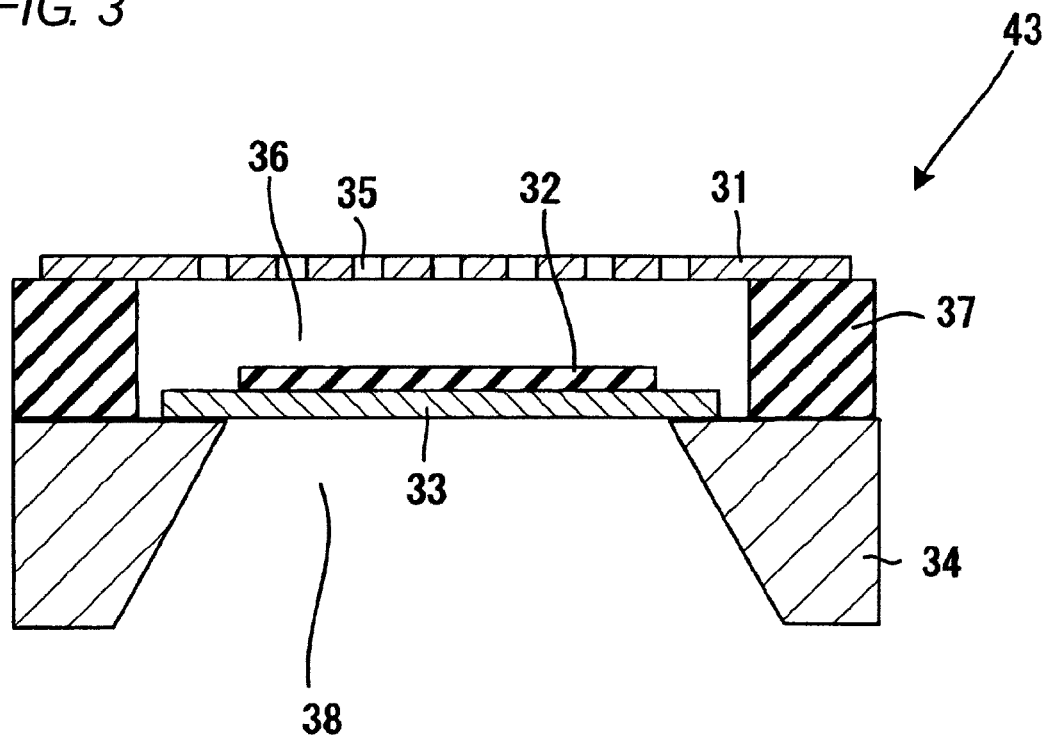
FIG. 3 is a view showing an MEMS microphone chip produced in the embodiment of the present invention.
Figure 4:
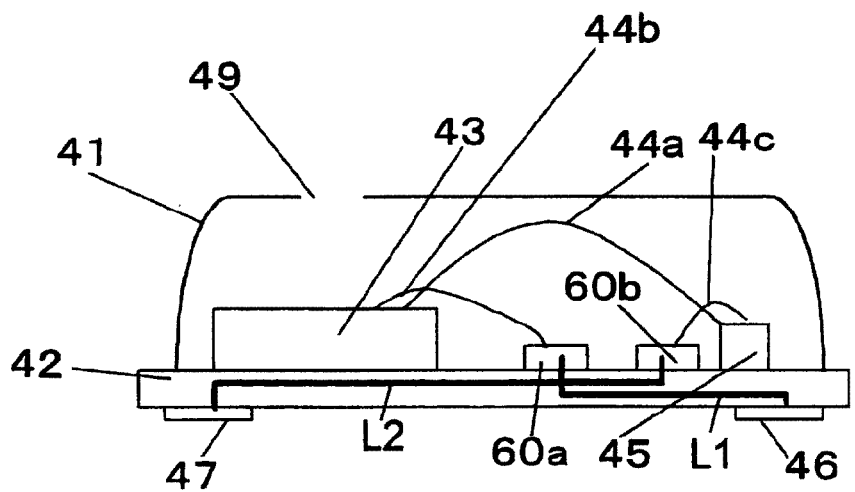
FIG. 4 is a view showing a mounted state of a microphone.

An embodiment of the present invention is hereunder described in detail by reference to the drawings. FIG. 1 is a diagrammatic illustration of ionizer-installed facilities of an embodiment of the present invention. FIG. 2 is an illustration of the ionizer-installed facilities in an electretization process. FIG. 3 is a view showing an MEMS microphone chip. FIG. 4 is a view showing a mounted state of the microphone chip.

FIG. 1 shows a static elimination process of the embodiment intended for stabilizing a retained charge amount of an electretized dielectric film 32 and for eliminating unnecessary electric charges. A conductive substance 4 such as a chassis of the facilities contacts a mounting board 42 (an insulating substance) serving as a base for securing an MEMS microphone chip 43 including the electretized dielectric film 32. In the static elimination process, the conductive substance 4 is not connected to a ground 5 and is held in a non-grounded state. By setting the conductive substance 4 in the non-grounded state, an electric current does not flow from the conductive substance 4 to an ionizer 1, so that a loop circuit is not formed. For this reason, an electric field does not develop, and pull-in of ions into the dielectric film 32, which is caused by the electric field, can be prevented. Accordingly, a change in a retained charge amount is prevented, so that a change in sensitivity of a microphone can be reduced. The ionizer 1 includes a needle electrode 11 and a high voltage power source 12 for feeding electric power to the needle electrode 11. The ionizer 1 functions as a static eliminator, and whether to function as the static eliminator depends on whether the conductive substance 4 such as the chassis is connected to a circuit.

FIG. 2 shows an electretization process for electretizing the dielectric film 32 according to the present embodiment. In the electretization process, the conductive substance 4 on which the MEMS microphone chip 43 is placed is grounded, and a distance between the ionizer 1 and the dielectric film 32 is set to 14 mm. Further, in a state where the fixed electrode 31 of the MEMS microphone chip 43 is held in an electric potential different from the ground potential, and corona discharge is performed at a point above the fixed electrode 31 by use of the ionizer 1, thereby electretizing the dielectric film 32. Thereafter, the static elimination process is performed as shown in FIG. 1. In the static elimination process the conductive substance 4 is disconnected from the ground 5, and ions are applied by the ionizer 1, thereby eliminating unnecessary electric charges.

In the electretization process, ions generated by corona discharge reach the dielectric film 32 via acoustic holes 35 of the fixed electrode 31 while controlled by an electric potential of the fixed electrode 31, whereby the dielectric film 32 can be electretized. The dielectric film 32 is electretized until the electric potential of the dielectric film 32 in the electretization process becomes equal to the electric potential of the fixed electrode 31. Therefore, the dielectric film 32 can be electretized to a target retained charge amount with superior accuracy and without previously studying a relationship between conditions for by electretization and a voltage used for electretizing the dielectric film 32 (i.e., an electric potential of the dielectric film by electretization).

In the above descriptions, the structure in which the conductive substance 4 is placed below the material (insulating substance) 3 is explained as shown in FIG. 1. However, even when a bottom of the chassis is made of a heat resistant insulating substance such as polycarbonate and when the conductive substance 4 located in the vicinity of the dielectric film 32 is removed, a similar advantages can be obtained because an electric field caused by the loop circuit is not formed.

An electretizing method of the embodiment of the present invention is now described by reference to the drawings.

FIG. 3 is a cross-sectional view of a device for describing a structure of an MEMS microphone chip (a silicon microphone) produced by micromachining a silicon substrate.

As shown in FIG. 3, the silicon microphone 43 includes: a silicon substrate (a silicon diaphragm) 34; a vibrating film 33 that covers a removal area 38 of the silicon substrate 34 and serves as one of electrodes of a condenser; the dielectric film 32 that is provided on the vibrating film 33 and serves as a film to be electretized; and the fixed electrode 31 that is supported on the silicon substrate 34 by a spacer 37 so as to be opposed to the vibrating film 33 and serves as the other one of the electrodes of the condenser. The fixed electrode 31 has the plurality of acoustic holes 35 (openings for guiding acoustic waves to the vibrating film 33). An air gap 36 formed by etching a sacrifice layer is interposed between the vibrating film 33 and the fixed electrode 31. The vibrating film 33, the fixed electrode 31, and the inorganic dielectric film 32, which form the silicon microphone 43, are produced by using a silicon micromachining technique and a CMOS (Complementary Field Effect Transistor) manufacturing process technique.

In the embodiment, the electretization is applied to the MEMS microphone chip.

The ionizer 1 used in the electretizing process shown in FIG. 2 (and also used in the static elimination process shown in FIG. 1) electretizes the silicon microphone such that the ions are applied by corona discharge using one needle electrode to one silicon microphone.

As shown in FIG. 2, the corona discharge by the ionizer 1 using the needle electrode 11 is used for an electretization process of the present embodiment. Specifically, the needle electrode 11 is positioned above the silicon microphone (semiconductor device) 43. The needle electrode 11 is connected to the high voltage power source 12 for generating corona discharge. The high voltage power source 12 applies a high voltage, for example, of about 5 to 10 kV, to the needle electrode 11. The static eliminator of the embodiment includes the ionizer 1 including the needle electrode 11 and the high voltage power source 12 for feeding power to the needle electrode, and the requirement of the static eliminator includes whether the conductive substance 4 such as the chassis is connected to a circuit. The electrode is not limited to the needle electrode and may have any shape as long as the electrode can generate corona discharge.

In an electretization process, a wiring connection different from that described in the embodiment is applied to the silicon microphone 43.

In the above-mentioned state shown in FIG. 2, ions generated by corona discharge using the needle electrode 11 are applied to the dielectric film 32 (see FIG. 3) provided in the silicon microphone 43. Accordingly, the dielectric film 32 (see FIG. 2) of the silicon microphone 43 is electretized at the voltage applied to the fixed electrode 31.

The fixed electrode 31 is grounded or set to a predetermined electric potential at this time. In other words, the fixed electrode 31 of the silicon microphone 43 is set to an electric potential different from the ground potential. Accordingly, a potential difference occurs between the vibrating film 33 and the fixed electrode 31. Consequently, the ions generated by the corona discharge using the needle electrode 11 are applied to the dielectric film 32 via the plurality of acoustic holes 35 formed in the fixed electrode 31.

The dielectric film 32 is gradually electretized, so that an electric potential (an electret potential) of the dielectric film 32 is gradually increased. Finally, the electric potential of the surface of the dielectric film 32 on the vibrating film 33 becomes equal to the electric potential of the fixed electrode 31.

When the electric potential of the dielectric film 32 becomes equal to the electric potential of the fixed electrode 31, ions are not applied to the dielectric film 32. Therefore, the dielectric film 32 is electretized until the electret potential becomes equal to the electric potential applied to the fixed electrode 31.

The electretization process is performed in a state in which the conductive substance 4 is grounded (see FIG. 2), under conditions where a distance between the ionizer and the dielectric film is 14 mm, an ionizer application time is 2.5 sec., an air flow rate is 0 L/min.

Subsequently, the conductive substance 4 is disconnected from the ground 5 as shown in FIG. 1, and then unnecessary electric charges are eliminated (the static elimination process).

The static elimination process is performed in a state in which the conductive substance 4 is grounded (see FIG. 1), under ionizer conditions where a distance between the ionizer and the dielectric film is 80 mm, an ionizer application time is 180 min., and an air flow rate is 10 L/min. When the conductive substance 4 is connected to the ground 5 as in the related art, an average change in the retained charge amount is −0.83 dB (on a sensitivity basis). On the contrary, when the conductive substance 4 is not grounded, the average change in the retained charge amount is confirmed to decrease to −0.04 dB.

FIG. 4 is a cross-sectional view showing a mounting structure of the electret microphone using the silicon substrate (a structure obtained after the microphone is sealed in a case). In FIG. 4, the elements common to FIG. 3 are assigned the same reference numerals, and their repeated explanations are omitted. Further, FIG. 4 shows a simplified silicon microphone (semiconductor device) 43 but an actual structure of the microphone is as illustrated in FIG. 3.

As shown in FIG. 4, the silicon microphone (a semiconductor device) 43 and an electronic component (an FET, a resistor, an amplifier, etc.) 45 serving as an element other than the silicon microphone 32 are mounted on the mounting board 42 made of plastic or ceramic.

A ground pattern 46 and a microphone signal output pattern 47 are formed on a back side of the mounting substrate 42. In a mounted state, the silicon microphone 43 is mounted on the mounting board 42 as shown in FIG. 4. The vibrating film (vibrating electrode) 33 serving as one of electrodes of the condenser is electrically connected to the electronic component 45 via a bonding wire 44a. Further, the electronic component 45 is electrically connected to a wiring pattern 60b on the mounting board 42 via a bonding wire 44c. The fixed electrode 31 serving as the other of the electrodes of the condenser is electrically connected to the wiring pattern 60a on the mounting board 42. Further, wiring patterns 60a and 60b are electrically connected to the ground pattern 46 and the microphone signal output pattern 47 formed on the back side of the mounting board 42 via lines L1 and L2 provided in the mounting board 42, respectively.

After the electretization process is completed, a shield case 41 is attached to the mounting board 42. A wide opening 49 is provided in the shield case 41 as an acoustic hole for guiding a audio wave.

As described above, according to the present embodiment, in the condenser microphone made by micromachining a silicon substrate, the dielectric film 32 is electretized with high accuracy to a target retained charge amount. Subsequently, the ground is disconnected, and the static elimination process is performed. As a result, unnecessary electric charges can be eliminated without the change in the retained charge amount. Thus, the change in microphone sensitivity and the change in the retained charge amount of the charged dielectric film can be reduced.

In the present embodiment, the method for electretizing the MEMS microphone chip is explained. However, the embodiment may be applied to an electretization on a wafer scale or to an electretization after mounting.

The present invention is not limited to the microphone chip described in the embodiment, and may be modified or applied by those skilled in the art based on the descriptions of the specification or well-known techniques, and such modifications and applications shall fall a scope of the present invention.

The present patent application is based on Japanese Patent Application (Japanese Patent Application No. 2008-147023) filed on Jun. 4, 2008, the entire contents of which are incorporated herein by reference.

A static eliminator of the embodiment can reduce a change in a retained charge amount of a electretized dielectric film and also eliminate unnecessary electric charges from the electretized device. The static eliminator can be applied to static elimination of various devices such as an MEMS microphone.

DESCRIPTIONS OF THE REFERENCE NUMERALS AND SYMBOLS

1 IONIZER
3 INSULATING SUBSTANCE
4 CONDUCTIVE SUBSTANCE
5 GROUND
11 NEEDLE ELECTRODE
12 HIGH VOLTAGE POWER SOURCE
31 FIXED ELECTRODE
32 DIELECTRIC FILM
33 VIBRATING FILM
34 SILICON SUBSTRATE

35 ACOUSTIC HOLE
36 AIR GAP
37 SPACER
41 SHIELD CASE
42 MOUNTING BOARD
43 SILICON MICROPHONE (SEMICONDUCTOR DEVICE)
45 ELECTRONIC COMPONENT
46 GROUND PATTERN
47 MICROPHONE SIGNAL OUTPUT PATTERN
49 OPENING
60a, 60b WIRING PATTERN

The invention claimed is:

1. A static eliminator comprising:
an ionizer comprising a power source and an electrode which applies ions to an electretized dielectric film to eliminate electric charges formed on the electretized dielectric film,
wherein the electretized dielectric film is in an electrically non-grounded state when the electric charges on the electretized dielectric film are eliminated.

2. The static eliminator according to claim 1, comprising:
a conductive substance,
wherein the conductive substance induces an electric field on the dielectric film and is in an electrically non-grounded state when the electric charges on the electretized dielectric film are eliminated.

3. The static eliminator according to claim 2,
wherein the conductive substance is connected to the dielectric film.

4. The static eliminator according to claim 1,
wherein the electrode is a needle electrode.

5. The static eliminator according to claim 1,
wherein the dielectric film is formed on a second film,
wherein the second film is formed on a substrate, and
wherein a third film is formed opposed to the second film.

6. The static eliminator according to claim 5,
wherein the second film is a vibrating film, and
wherein the third film is a fixed film.

7. The static eliminator according to claim 5,
wherein the substrate is in an electrically non-grounded state when the electric charges on the electretized dielectric film are eliminated.

8. A microphone electretizing apparatus for electretizing a dielectric film provided in a microphone, the apparatus comprising:
an ionizer which electretizes the dielectric film and eliminates electric charges on the electretized dielectric film,
wherein, the electretized dielectric film, and a support for supporting the dielectric film or a vicinity thereof are in an electrically non-grounded state when the electric charges on the electretized dielectric film are eliminated.

9. The microphone electretizing apparatus according to claim 8,
wherein the dielectric film is formed on a second film,
the second film is formed on a substrate,
a third film is formed opposed to the second film.

10. The microphone electretizing apparatus according to claim 9,
wherein the second film is a vibrating film, and
wherein the third film is a fixed film.

11. The microphone electretizing apparatus according to claim 9,
wherein the substrate is in an electrically non-grounded state when the electric charges on the electretized dielectric film are eliminated.

12. A static eliminating method comprising:
eliminating electric charges on an electretized dielectric film by applying ions to the electretized dielectric film using the ionizer while the dielectric film is in an electrically non-grounded state.

13. A microphone electretizing method comprising:
electretizing a dielectric film by applying ions to the dielectric film using an ionizer; and
eliminating electric charges on the electretized dielectric film by applying ions to the electretized dielectric film using the ionizer while the dielectric film is in an electrically non-grounded state.

14. The microphone electretizing method according to claim 13,
wherein the dielectric film is formed above a wafer, and
wherein said electretizing is performed on the wafer.

* * * * *